United States Patent [19]

Starewicz et al.

[11] Patent Number: 4,775,836
[45] Date of Patent: Oct. 4, 1988

[54] FLOW-THROUGH CELL FOR NMR SPECTROSCOPY OF LIQUID SAMPLES

[75] Inventors: Piotr Starewicz; Michael Albright, both of North Plainfield, N.J.

[73] Assignee: Siemens Medical Systems, Inc., Iselin, N.J.

[21] Appl. No.: 32,121

[22] Filed: Mar. 27, 1987

[51] Int. Cl.$^4$ ............................................. G01R 33/20
[52] U.S. Cl. .................................. 324/318; 324/306
[58] Field of Search ............. 324/300, 306, 318, 307, 324/308, 317, 321, 71.1, 204; 73/864.01, 864.02, 864.21, 864.23; D24/55; 251/315, 368; 137/559

[56] References Cited

U.S. PATENT DOCUMENTS

| | | | |
|---|---|---|---|
| 3,111,136 | 11/1963 | Persidsky | 251/368 |
| 3,564,400 | 2/1971 | Pike et al. | 324/306 |
| 4,246,537 | 1/1981 | Laukien et al. | 324/321 |
| 4,545,564 | 10/1985 | Krosoczka et al. | 251/315 |

FOREIGN PATENT DOCUMENTS 0819657  4/1981  U.S.S.R. ............................. 324/300

OTHER PUBLICATIONS

Koryakov, V. I., et al., "Polyethylene Vessel . . . Polar Solvents", translation from Pribory I Tekhnika Eksperimenta, No. 4, Jul.-Aug., 1971.

Primary Examiner—Michael J. Tokar
Assistant Examiner—Kevin D. O'Shea
Attorney, Agent, or Firm—Mark H. Jay

[57] ABSTRACT

A flow-through cell for subjecting a liquid sample to NMR spectroscopy retains the sample in a substantially spherical volume which, in use, is located inside the RF coil. Because the volume is spherical, artifacts caused by inhomogeneity in magnetic susceptibility are reduced.

2 Claims, 1 Drawing Sheet

FLOW-THROUGH CELL FOR NMR SPECTROSCOPY OF LIQUID SAMPLES

BACKGROUND OF THE INVENTION

The invention relates to nuclear magnetic resonance (NMR) spectroscopy, and more particularly relates to NMR spectroscopic analysis of liquid samples.

In conventional NMR spectroscopic analysis, a sample is placed in a sample tube and the sample tube is rotated at high speed (by a precision spinner turbine that is press-fit over the sample tube) so that the sample spins within the XY plane of the RF field. This is done because the sample is non-spherical and it is necessary that all parts of the sample be exposed to the average field flux. Without such rotation, the magnetic field gradients introduce artifacts in the NMR spectrum because the sample is non-spherical and all parts of the sample are not exposed to identical field strengths.

For certain applications, this has disadvantages. For example, it has been proposed to test human patients for cancer by taking a blood sample and subjecting it to NMR spectroscopic analysis. A dedicated machine which would be suitable for performing this function would be required to analyse many liquid samples, one after the other. If such testing were to be carried out by adapting existing technology, it would be necessary to e.g. repeatedly use the same sample tube or to use a plurality of sample tubes. Both approaches are not entirely satisfactory. The use of a plurality of sample tubes is unsatisfactory because of the time required to change samples and also because of the complicated apparatus needed to remove each sample tube and associated spinner turbine from the field region and to replace them with the next sample tube and spinner turbine. It is also unsatisfactory because spinner turbines are expensive. Reusing a single sample tube is likewise unsatisfactory because this requires manual handling or at least prolongs processing because of the number of process steps required. This can age the samples and introduce errors.

It would be advantageous to provide a device which would facilitate NMR spectroscopic analysis of a series of liquid samples.

SUMMARY OF THE INVENTION

In accordance with the invention, there is provided a flow-through cell which contains a substanially spherical volume. This volume is diametrically ported so that a fluid sample such as human blood (or other body fluids) can be introduced into the volume and then flushed out of it.

In one preferred embodiment, a flow-through cell is of glass and has an enlarged region and two dimetrically opposed hollow cylindrical regions. In use, the enlarged region is located inside the RF coil at the homogeneous center of the RF field.

In another preferred embodiment, there is provided a cylindrical structure, advantageously a glass jacket which contains a liner. The liner is hollow and has an interior recess which bounds a substantially spherical volume and also bounds an axially extending flow channel which communicates with the volume across its diameter. Advantageously, the liner is made of a material (glass or plastic) which is doped to have a magnetic susceptibility which approximately matches the susceptibility of the fluid sample which is introduced into it.

Because the sample is retained in a spherical chamber, artifacts caused by inhomogeneities in magnetic susceptibility do not arise. This is because the sample is radically symmetrical about its center, and this symmetry is least disturbing to the RF field. Further, because the invention is suitable for in-line use, the introduction and removal of samples and cleaning solutions is greatly facilitated.

BRIEF DESCRIPTION OF THE DRAWINGS

Exemplary and non-limiting preferred embodiments of the invention are shown in the drawings, in which.

DETAILED DESCRIPTION OF PREFERRED EMBODIMENTS

Figure 1:
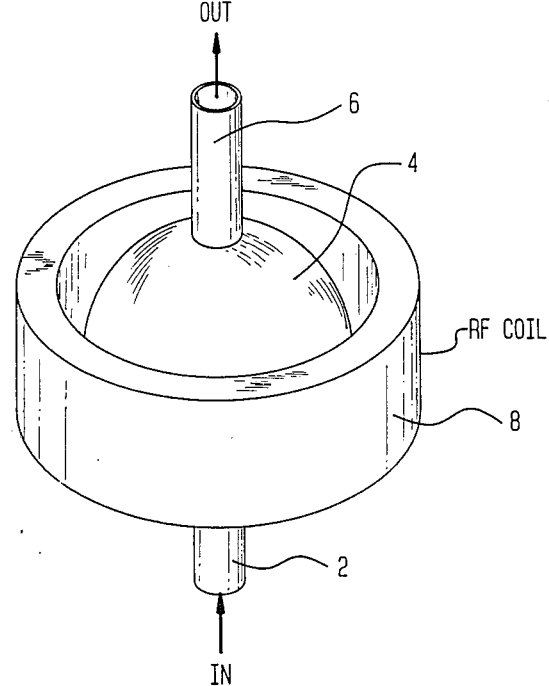
FIG. 1 is a perspective drawing of a first preferred embodiment of the invention.
Figure 2:
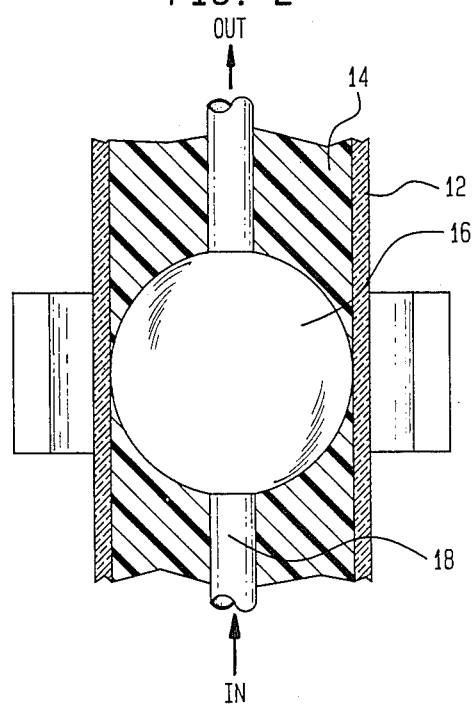
FIG. 2 is a cross-sectional drawing of a second preferred embodiment of the invention.

A first preferred embodiment of the invention, such as is illustrated in FIG. 1, is made of a unitary piece of relatively thin glass (but may also be assembled from separate pieces). A hollow cylindrical region 2 communicates with the interior of an enlarged region 4 which encloses a substantially spherical volume. A hollow cylindrical region 6 also communicates with the interior of the enlarged region 4 and the cylindrical regions 2 and 6 are axially aligned across a diameter of the enlarged region 4.

Because the enlarged region 4 encloses a sphere, artifacts caused by inhomogeniety of the magnetic field do not arise. In use, the enlarged region 4 is placed inside the RF coil 8. If desired, the coil 8 can be wound closely around the enlarged region 4 so that the coil 8 is almost spherical; this improves coupling between the coil 8 and the sample (not shown) inside the enlarged region 4.

As shown, cylindrical region 2 is at the bottom of the device and is used as an inlet; cylindrical region 6, located at the top, is used as an outlet. This is to prevent air bubbles from getting trapped in the stream of samples which is directed through the device.

The second preferred embodiment has a cylindrical shape, rather than a sphercial shape. Advangageously, it has a cylindrical glass jacket 12. Inside this jacket is a liner 14 which also can be glass (and can even be integral with the jacket 12) but which is advantageously made of appropriately doped plastic. The liner 14 has a central recess which bounds a substantially spherical volume 16 and an axially extending flow channel 18 which communicates with the volume 16 across its diameter.

By using doped plastic for the liner, the magnetic susceptibility of the liner is matched to the magnetic susceptibility of a blood sample which is analysed in an NMR spectroscope. This is known by itself and will not be further discussed; persons skilled in the art can select appropriate plastics and dopants.

Those skilled in the art will understand that changes can be made in the preferred embodiments here described, and that these embodiments can be used for other purposes. Such changes and uses are within the scope of the invention, which is limited only by the claims which follow.

What is claimed is:

1. A flow-through cell for subjecting a liquid sample to NMR spectroscopy, comprising:
   a cylindrical glass jacket; and a liner located within said jacket and having an interior recess shaped to bound a substantially spherical volume and an axially extending flow channel which communicates with said volume across a diameter thereof.

2. The cell of claim 1, wherein said liner is of a doped plastic having a magnetic susceptibility which approximately matches the magnetic susceptibility of blood plasma.

* * * * *